US009601523B2

(12) United States Patent
Zhang et al.

(10) Patent No.: US 9,601,523 B2
(45) Date of Patent: Mar. 21, 2017

(54) DUAL GATE TFT SUBSTRATE STRUCTURE UTILIZING COA SKILL

(71) Applicant: Shenzhen China Star Optoelectronics Technology Co., Ltd., Shenzhen (CN)

(72) Inventors: Hejing Zhang, Shenzhen (CN); Chihyuan Tseng, Shenzhen (CN); Chihyu Su, Shenzhen (CN); Wenhui Li, Shenzhen (CN); Longqiang Shi, Shenzhen (CN); Xiaowen Lv, Shenzhen (CN); Shimin Ge, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/771,202

(22) PCT Filed: May 21, 2015

(86) PCT No.: PCT/CN2015/079482
§ 371 (c)(1),
(2) Date: Aug. 27, 2015

(87) PCT Pub. No.: WO2016/176878
PCT Pub. Date: Nov. 10, 2016

(65) Prior Publication Data
US 2016/0351599 A1 Dec. 1, 2016

(30) Foreign Application Priority Data
May 5, 2015 (CN) .......................... 2015 1 0224511

(51) Int. Cl.
*H01L 27/12* (2006.01)
*G02F 1/1368* (2006.01)
(Continued)

(52) U.S. Cl.
CPC ........ *H01L 27/1248* (2013.01); *G02F 1/1368* (2013.01); *H01L 21/77* (2013.01);
(Continued)

(58) Field of Classification Search
CPC ............. H01L 29/7869; H01L 27/1225; H01L 29/78648; H01L 27/124; H01L 27/3262
(Continued)

(56) References Cited

U.S. PATENT DOCUMENTS

2014/0159068 A1* 6/2014 Park .................... H01L 27/1244
257/88
2014/0326990 A1* 11/2014 Wang ................... H01L 27/1225
257/43
(Continued)

*Primary Examiner* — David Vu
*Assistant Examiner* — Jonathan Han
(74) *Attorney, Agent, or Firm* — Leong C. Lei

(57) ABSTRACT

The present invention provides a dual gate TFT substrate structure utilizing COA skill, comprising a substrate (1), a bottom gate (2) positioned on the substrate (1), a bottom gate isolation layer (3) covering the bottom gate (2) and the substrate (1), an active layer (4) positioned on the bottom gate isolation layer (3) above the bottom gate (2), an etching stopper layer (5) positioned on the active layer (4) and the bottom gate isolation layer (3), a source/a drain (6) positioned on the etching stopper layer (5) and respectively contacted with two ends of the active layer (4), color filter (8) positioned on the source/the drain (6) and the etching stopper layer (5), and a top gate (9) positioned on the color filter (8) and contacted with the bottom gate (2); the active layer (4) and the thin film of the previous manufacture process can be effectively protected and the original property and the stability of the active layer (4) and the thin film of the previous manufacture process can be ensured.

19 Claims, 3 Drawing Sheets

(51) Int. Cl.
*H01L 21/77* (2006.01)
*H01L 29/786* (2006.01)
*H01L 27/32* (2006.01)

(52) U.S. Cl.
CPC .............. *H01L 27/12* (2013.01); *H01L 27/32* (2013.01); *H01L 27/322* (2013.01); *H01L 29/786* (2013.01); *H01L 29/78606* (2013.01); *H01L 29/78648* (2013.01); *H01L 27/1225* (2013.01); *H01L 27/3262* (2013.01); *H01L 29/7869* (2013.01); *H01L 29/78663* (2013.01); *H01L 29/78672* (2013.01)

(58) Field of Classification Search
USPC ................ 257/43, 72, E29.273, 59; 438/104
See application file for complete search history.

(56) References Cited

U.S. PATENT DOCUMENTS

2014/0340608 A1* 11/2014 Yamazaki ............. G02F 1/1368
349/47
2015/0037943 A1* 2/2015 Park ................... H01L 27/1288
438/158
2015/0062522 A1* 3/2015 You .................. G02F 1/134363
349/143

* cited by examiner

DUAL GATE TFT SUBSTRATE STRUCTURE UTILIZING COA SKILL

FIELD OF THE INVENTION

The present invention relates to a display technology field, and more particularly to a dual gate TFT substrate structure utilizing COA skill.

BACKGROUND OF THE INVENTION

In the display technology field, the flat panel device possesses advantages of high image quality, power saving and thin body. Thus, it has been widely applied in various consumer electrical products, such as mobile phone, television, personal digital assistant, digital camera, notebook, laptop, and becomes the major display device.

The common flat panel display device at present mainly comprises a Liquid Crystal Display (LCD) and an Active Matrix Organic Light-Emitting Diode (AMOLED). The Thin Film transistor (TFT) is a main drive element in the LCD and the AMOLED display devices. A plurality of thin film transistors are aligned in array on the TFT substrate.

Generally, in the active matrix display device, and particularly in the OLED, the importance of the threshold voltage (Vth) is significant. The stable, uniform threshold voltage can make the display brightness of the OLED be more even and the display quality be higher. The dual gate thin film transistor (Dual-gate TFT) possesses better performance than the common single gate thin film transistor (single-gate TFT). For example, the electron mobility is higher, and the current of activation state is larger, and the subthreshold swing is smaller, and the stability and the uniformity of the threshold voltage are better, and the gate voltage bias and the light stability are better.

In the manufacture process of the OLED, for reducing the difficulty of the manufacture and preventing the deterioration and unevenness of the chromaticity and brightness of the organic light emitting material, the display method of white organic light emitting diode in cooperation with the Color Filter (CF) is commonly utilized. The manufactured of the color filter in the white light OLED display device is mainly to perform coating after accomplishing the array manufacture process of the TFT substrate. Namely, the Color Filter On Array (COA) technology is utilized.

As shown in FIG. 1, a dual gate TFT substrate structure utilizing COA skill according to prior art comprises:
  a substrate 100;
  a bottom gate 200, a bottom gate isolation layer 300, an active layer 400, an etching stopper layer 500, a source/a drain 600 stacking up on the substrate 100 from bottom to top in orders;
  a passivation layer 700 positioned on the source/the drain 600 and the etching stopper layer 500;
  and a top gate 810 and a color filter 830 positioned on the passivation layer 700.

In the dual gate TFT substrate structure utilizing COA skill, the top gate 810 and the color filter 830 are positioned at the same layer, which are on the passivation layer 700. The color filter 830 merely functions for filtering the light. The passivation layer 700 is employed to be the top gate isolation layer of the top gate 810 at the same time. Thus, the passivation layer 700 requires great stability and tightness. In prior art, the inorganic material possessing great tightness and stability, such as Silicon Oxide or Silicon Nitride is utilized. In relatively higher temperature environment, which is generally above the 350° C., the passivation layer 700 is deposed and formed. The technical problem of this is: the gas of deposing the passivation layer 700 at high temperature will enter the thin film deposed in the previous manufacture process and change the property of the isolation layer or the active layer, or cause the metal electrode hillock phenomenon. Ultimately, the abnormality of the TFT electrical property can caused thereby.

SUMMARY OF THE INVENTION

An objective of the present invention is to provide a dual gate TFT substrate structure utilizing COA skill. With a color filter to be a passivation layer and a top gate isolation layer at the same time, the deposition of the inorganic passivation layer at the higher temperature is not required in the manufacture process. Thus, it can be prevented that the gas of deposing the inorganic passivation layer at high temperature enters the thin film deposed in the previous manufacture process to effectively protect the active layer and the thin film of the previous manufacture process. The original property and the stability of the active layer and the thin film of the previous manufacture process can be ensured to stabilize the electrical property of the dual gate TFT.

For realizing the aforesaid objective, the present invention provides a dual gate TFT substrate structure utilizing COA skill, comprising: a substrate, a bottom gate positioned on the substrate, a bottom gate isolation layer covering the bottom gate and the substrate, an active layer positioned on the bottom gate isolation layer above the bottom gate, an etching stopper layer positioned on the active layer and the bottom gate isolation layer, a source/a drain positioned on the etching stopper layer and respectively contacted with two ends of the active layer, a color filter positioned on the source/the drain and the etching stopper layer and a top gate positioned on the color filter and contacted with the bottom gate;
  the color filter is employed to be a passivation layer and a top gate isolation layer at the same time.

The dual gate TFT substrate structure utilizing COA skill further comprises an inorganic passivation layer sandwiched between the source/the drain, the etching stopper layer and the color filter.

The source/the drain are contacted with the two ends of the active layer through the via holes penetrating the etching stopper layer.

The top gate is contacted with the bottom gate through a via hole penetrating the etching stopper layer and the bottom gate isolation layer.

The top gate is contacted with the bottom gate through a via hole penetrating the inorganic passivation layer, the etching stopper layer and the bottom gate isolation layer.

The top gate is a transparent electrode.

The transparent electrode is an ITO electrode, an IZO electrode or a thin metal electrode.

Material of the active layer is one of amorphous silicon based semiconductor, polysilicon based semiconductor and Zinc Oxide based semiconductor.

Material of the bottom gate and the source/the drain is a stack combination of one or more of molybdenum, titanium, aluminum and copper, and material of the bottom gate isolation layer is Silicon Nitride, Silicon Oxide, or a combination of the two, and material of the etching stopper layer is aluminum oxide.

Material of the inorganic passivation layer is Silicon Nitride, Silicon Oxide, or a combination of the two.

The present invention further provides a dual gate TFT substrate structure utilizing COA skill, comprising: a substrate, a bottom gate positioned on the substrate, a bottom gate isolation layer covering the bottom gate and the substrate, an active layer positioned on the bottom gate isolation layer above the bottom gate, an etching stopper layer positioned on the active layer and the bottom gate isolation layer, a source/a drain positioned on the etching stopper layer and respectively contacted with two ends of the active layer, a color filter positioned on the source/the drain and the etching stopper layer and a top gate positioned on the color filter and contacted with the bottom gate;

the color filter is employed to be a passivation layer and a top gate isolation layer at the same time;

the dual gate TFT substrate structure further comprises an inorganic passivation layer sandwiched between the source/the drain, the etching stopper layer and the color filter;

wherein the source/the drain are contacted with the two ends of the active layer through the via holes penetrating the etching stopper layer;

wherein the top gate is contacted with the bottom gate through a via hole penetrating the inorganic passivation layer, the etching stopper layer and the bottom gate isolation layer;

wherein the top gate is a transparent electrode;

wherein the transparent electrode is an ITO electrode, an IZO electrode or a thin metal electrode.

The benefits of the present invention are: the present invention provides a dual gate TFT substrate structure utilizing COA skill. With positioning the top gate on the color filter, the aforesaid color filter is employed to be the passivation layer and the top gate isolation layer at the same time. The deposition of the inorganic passivation layer at the higher temperature is not required in the manufacture process. Thus, it can be prevented that the gas of deposing the inorganic passivation layer at high temperature enters the thin film deposed in the previous manufacture process to effectively protect the active layer and the thin film of the previous manufacture process. The original property and the stability of the active layer and the thin film of the previous manufacture process can be ensured to stabilize the electrical property of the dual gate TFT.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 2:
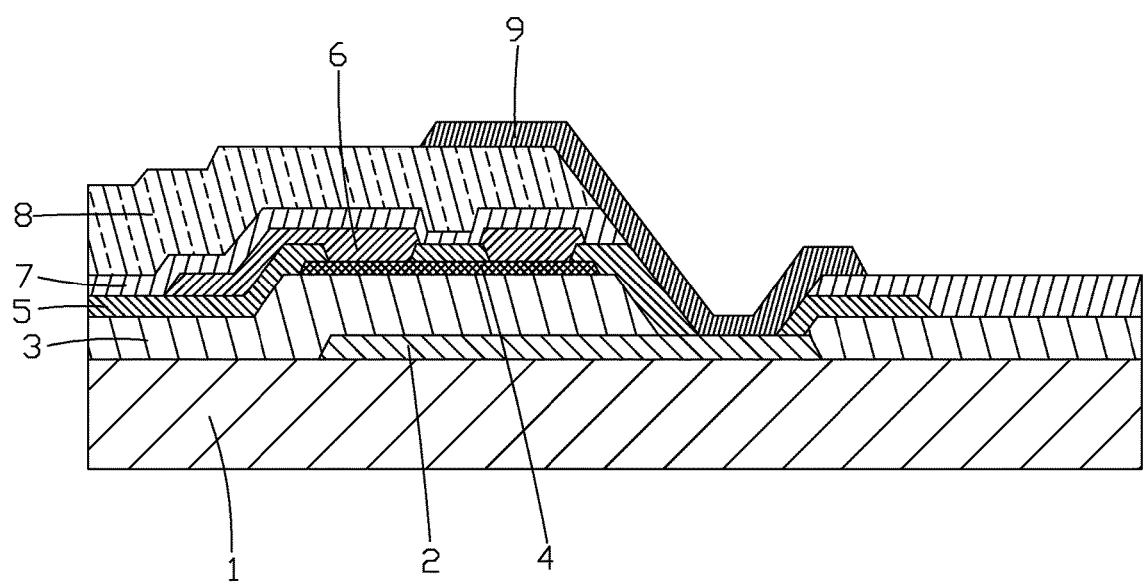
FIG. 2 is a sectional diagram of a dual gate TFT substrate structure utilizing COA skill according to the first embodiment of the present invention.

The present invention provides a dual gate TFT substrate structure utilizing COA skill. FIG. 2 shows a dual gate TFT substrate structure utilizing COA skill according to the first embodiment of the present invention, comprising a substrate 1, a bottom gate 2 positioned on the substrate 1, a bottom gate isolation layer 3 covering the bottom gate 2 and the substrate 1, an active layer 4 positioned on the bottom gate isolation layer 3 above the bottom gate 2, an etching stopper layer 5 positioned on the active layer 4 and the bottom gate isolation layer 3, a source/a drain 6 positioned on the etching stopper layer 5 and respectively contacted with two ends of the active layer 4, an inorganic passivation layer 7 positioned on the source/the drain 6 and the etching stopper layer 5, a color filter 8 positioned on the inorganic passivation layer 7 and a top gate 9 positioned on the color filter 8 and contacted with the bottom gate 2.

The color filter 8 and the inorganic passivation layer 7 are employed to be a passivation layer, together. Meanwhile, the color filter 8 is also employed to be a top gate isolation layer.

Figure 1:
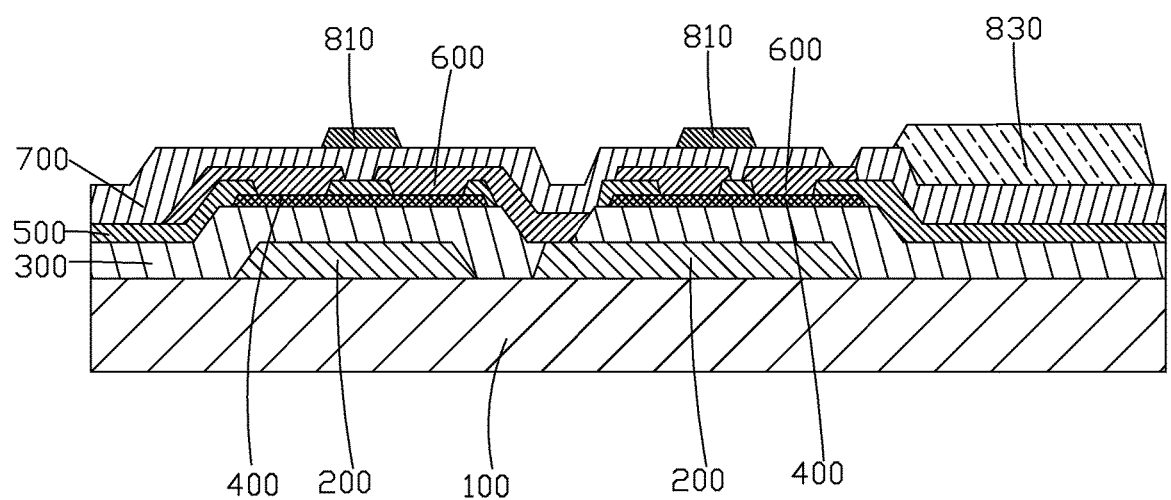
FIG. 1 is a sectional diagram of a dual gate TFT substrate structure utilizing COA skill according to prior art.

Because the color filter 8 overlays on the inorganic passivation layer 7, and the two commonly function for being the passivation layer. Therefore, the demand of the tightness to the inorganic passivation layer 7 is relatively reduced in comparison of the inorganic passivation layer 7 and the inorganic passivation layer 700 in the dual gate TFT substrate structure utilizing COA skill shown in FIG. 1, and the deposition can be performed in the environment of which the temperature is relatively lower, and not exceeds 210° C. Thus, it can be prevented that the gas of deposing the inorganic passivation layer at high temperature enters the thin film deposed in the previous manufacture process to effectively protect the active layer 4 and the thin film of the previous manufacture process. The original property and the stability of the active layer 4 and the thin film of the previous manufacture process can be ensured to stabilize the electrical property of the dual gate TFT.

Specifically, the source/the drain 6 are contacted with the two ends of the active layer 4 through the via holes penetrating the etching stopper layer 5; the top gate 9 is contacted with the bottom gate 2 through a via hole penetrating the inorganic passivation layer 7, the etching stopper layer 5 and the bottom gate isolation layer 3.

The color filter 8 comprises red color filters, green color filters and blue color filters.

Preferably, material of the bottom gate 2 and the source/ the drain 6 is a stack combination of one or more of molybdenum, titanium, aluminum and copper; material of the bottom gate isolation layer 3 is Silicon Nitride, Silicon Oxide, or a combination of the two; material of the active layer 4 is one of amorphous silicon based semiconductor, polysilicon based semiconductor and Zinc Oxide based semiconductor, such as Indium Gallium Zinc Oxide (IGZO) semiconductor; material of the etching stopper layer 5 is aluminum oxide.

Significantly, the top gate 9 can be an opaque electrode or a transparent electrode, such as an Indium Tin Oxide (ITO) electrode, an Indium Zinc Oxide (IZO) electrode or a thin metal electrode, of which silver can be illustrated. As the top gate 9 is a transparent electrode, the color filter 8 further functions for light shielding to promote the illumination stability of the dual gate TFT.

Figure 3:
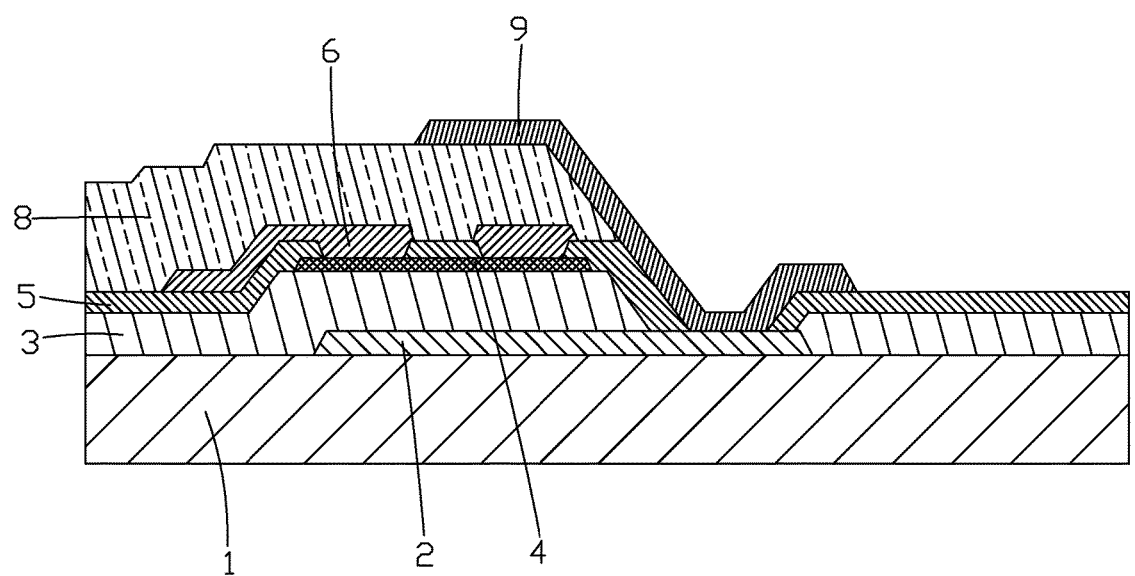
FIG. 3 is a sectional diagram of a dual gate TFT substrate structure utilizing COA skill according to the second embodiment of the present invention.

FIG. 3 shows a dual gate TFT substrate structure utilizing COA skill according to the second embodiment of the present invention. Compared with the first embodiment, the second embodiment eliminates the inorganic passivation layer 7 sandwiched between the source/the drain 6, the etching stopper layer 5 and the color filter 8. The color filter 8 is employed to be a passivation layer and a top gate isolation layer at the same time. Correspondingly, the top gate 9 is contacted with the bottom gate 2 through a via hole penetrating the etching stopper layer 5 and the bottom gate isolation layer 3. Others are the same as the first embodiment. The repeated description is omitted here.

The second embodiment eliminate the inorganic passivation layer 7, and the mask for manufacturing the inorganic passivation layer 7 can be saved in comparison with the first embodiment. The color filter 8 does not require the high temperature deposition. Thus, it can be prevented that the gas of deposing the inorganic passivation layer at high temperature enters the thin film deposed in the previous manufacture process to effectively protect the active layer 4 and the thin film of the previous manufacture process. The original property and the stability of the active layer 4 and the thin film of the previous manufacture process can be ensured to stabilize the electrical property of the dual gate TFT.

In conclusion, the present invention provides a dual gate TFT substrate structure utilizing COA skill. With positioning the top gate on the color filter, the aforesaid color filter is employed to be the passivation layer and the top gate isolation layer at the same time. The deposition of the inorganic passivation layer at the higher temperature is not required in the manufacture process. Thus, it can be prevented that the gas of deposing the inorganic passivation layer at high temperature enters the thin film deposed in the previous manufacture process to effectively protect the active layer and the thin film of the previous manufacture process. The original property and the stability of the active layer and the thin film of the previous manufacture process can be ensured to stabilize the electrical property of the dual gate TFT.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A dual gate TFT substrate structure utilizing COA skill, comprising: a substrate, a bottom gate positioned on the substrate, a bottom gate isolation layer covering the bottom gate and the substrate, an active layer positioned on the bottom gate isolation layer above the bottom gate, an etching stopper layer positioned on the active layer and the bottom gate isolation layer, a source/a drain positioned on the etching stopper layer and respectively contacted with two ends of the active layer, a color filter positioned on the source/the drain and the etching stopper layer and a top gate positioned on the color filter and contacted with the bottom gate;

wherein the color filter is employed to be a passivation layer and a top gate isolation layer at the same time; and wherein the bottom gate and the top gate are located on opposites sides of the active layer and corresponding to the active layer, the bottom gate and the top gate being electrically connected to have a common electrical potential to be both acting on the active layer.

2. The dual gate TFT substrate structure utilizing COA skill according to claim 1, further comprising an inorganic passivation layer sandwiched between the source/the drain, the etching stopper layer and the color filter.

3. The dual gate TFT substrate structure utilizing COA skill according to claim 2, wherein the source/the drain are contacted with the two ends of the active layer through the via holes penetrating the etching stopper layer.

4. The dual gate TFT substrate structure utilizing COA skill according to claim 2, wherein the top gate is contacted with the bottom gate through a via hole penetrating the inorganic passivation layer, the etching stopper layer and the bottom gate isolation layer.

5. The dual gate TFT substrate structure utilizing COA skill according to claim 2, wherein the top gate is a transparent electrode.

6. The dual gate TFT substrate structure utilizing COA skill according to claim 5, wherein the transparent electrode is an ITO electrode, an IZO electrode or a thin metal electrode.

7. The dual gate TFT substrate structure utilizing COA skill according to claim 2, wherein material of the active layer is one of amorphous silicon based semiconductor, polysilicon based semiconductor and Zinc Oxide based semiconductor.

8. The dual gate TFT substrate structure utilizing COA skill according to claim 2, wherein material of the bottom gate and the source/the drain is a stack combination of one or more of molybdenum, titanium, aluminum and copper, and material of the bottom gate isolation layer is Silicon Nitride, Silicon Oxide, or a combination of the two, and material of the etching stopper layer is aluminum oxide.

9. The dual gate TFT substrate structure utilizing COA skill according to claim 2, wherein material of the inorganic passivation layer is Silicon Nitride, Silicon Oxide, or a combination of the two.

10. The dual gate TFT substrate structure utilizing COA skill according to claim 1, wherein the source/the drain are contacted with the two ends of the active layer through the via holes penetrating the etching stopper layer.

11. The dual gate TFT substrate structure utilizing COA skill according to claim 1, wherein the top gate is contacted with the bottom gate through a via hole penetrating the etching stopper layer and the bottom gate isolation layer.

12. The dual gate TFT substrate structure utilizing COA skill according to claim 1, wherein the top gate is a transparent electrode.

13. The dual gate TFT substrate structure utilizing COA skill according to claim 12, wherein the transparent electrode is an ITO electrode, an IZO electrode or a thin metal electrode.

14. The dual gate TFT substrate structure utilizing COA skill according to claim 1, wherein material of the active layer is one of amorphous silicon based semiconductor, polysilicon based semiconductor and Zinc Oxide based semiconductor.

15. The dual gate TFT substrate structure utilizing COA skill according to claim 1, wherein material of the bottom gate and the source/the drain is a stack combination of one or more of molybdenum, titanium, aluminum and copper, and material of the bottom gate isolation layer is Silicon Nitride, Silicon Oxide, or a combination of the two, and material of the etching stopper layer is aluminum oxide.

16. A dual gate TFT substrate structure utilizing COA skill, comprising: a substrate, a bottom gate positioned on the substrate, a bottom gate isolation layer covering the bottom gate and the substrate, an active layer positioned on the bottom gate isolation layer above the bottom gate, an etching stopper layer positioned on the active layer and the bottom gate isolation layer, a source/a drain positioned on the etching stopper layer and respectively contacted with two ends of the active layer, a color filter positioned on the source/the drain and the etching stopper layer and a top gate positioned on the color filter and contacted with the bottom gate;

wherein the color filter is employed to be a passivation layer and a top gate isolation layer at the same time;

wherein the dual gate TFT substrate structure further comprises an inorganic passivation layer sandwiched between the source/the drain, the etching stopper layer and the color filter;

wherein the source/the drain are contacted with the two ends of the active layer through the via holes penetrating the etching stopper layer;

wherein the top gate is contacted with the bottom gate through a via hole penetrating the inorganic passivation layer, the etching stopper layer and the bottom gate isolation layer;

wherein the top gate is a transparent electrode;

wherein the transparent electrode is an ITO electrode, an IZO electrode or a thin metal electrode; and wherein the bottom gate and the top gate are located on opposites sides of the active layer and corresponding to the active layer, the bottom gate and the top gate being electrically connected to have a common electrical potential to be both acting on the active layer.

17. The dual gate TFT substrate structure utilizing COA skill according to claim 16, wherein material of the active layer is one of amorphous silicon based semiconductor, polysilicon based semiconductor and Zinc Oxide based semiconductor.

18. The dual gate TFT substrate structure utilizing COA skill according to claim 16, wherein material of the bottom gate and the source/the drain is a stack combination of one or more of molybdenum, titanium, aluminum and copper, and material of the bottom gate isolation layer is Silicon Nitride, Silicon Oxide, or a combination of the two, and material of the etching stopper layer is aluminum oxide.

19. The dual gate TFT substrate structure utilizing COA skill according to claim 16, wherein is material of the inorganic passivation layer is Silicon Nitride, Silicon Oxide, or a combination of the two.

* * * * *